United States Patent
Pfirsch

(10) Patent No.: US 8,643,085 B2
(45) Date of Patent: Feb. 4, 2014

(54) HIGH-VOLTAGE-RESISTANT SEMICONDUCTOR COMPONENT HAVING VERTICALLY CONDUCTIVE SEMICONDUCTOR BODY AREAS AND A TRENCH STRUCTURE

(75) Inventor: Frank Pfirsch, München (DE)

(73) Assignee: Infineon Technologies AG, Neubiberg (DE)

( * ) Notice: Subject to any disclaimer, the term of this patent is extended or adjusted under 35 U.S.C. 154(b) by 1272 days.

(21) Appl. No.: 11/234,585

(22) Filed: Sep. 23, 2005

(65) Prior Publication Data

US 2006/0065923 A1 Mar. 30, 2006

(30) Foreign Application Priority Data

Sep. 24, 2004 (DE) .......................... 10 2004 046 697

(51) Int. Cl.
*H01L 29/66* (2006.01)

(52) U.S. Cl.
USPC ........... 257/328; 257/107; 257/331; 257/339; 257/408; 257/471; 257/500; 257/55; 257/594; 257/E21.061; 257/E27.055; 257/E27.069; 257/E29.262; 257/E29.022; 257/E29.068; 257/E29.327; 438/133; 438/135; 438/137; 438/138; 438/140; 438/167; 438/173; 438/197; 438/268

(58) Field of Classification Search
USPC .................. 257/328, 339, E29.027, E29.068; 438/133, 137, 138
See application file for complete search history.

(56) References Cited

U.S. PATENT DOCUMENTS

| | | | |
|---|---|---|---|
| 4,587,712 A * | 5/1986 | Baliga ........................... | 438/137 |
| 4,893,160 A * | 1/1990 | Blanchard ..................... | 257/334 |
| 5,282,018 A | 1/1994 | Hiraki et al. .................. | 257/296 |
| 5,304,821 A * | 4/1994 | Hagino ......................... | 257/133 |
| 5,471,075 A * | 11/1995 | Shekar et al. ................. | 257/139 |
| 5,554,862 A * | 9/1996 | Omura et al. ................. | 257/137 |
| 5,960,277 A * | 9/1999 | Blanchard ..................... | 438/234 |
| 6,201,279 B1 * | 3/2001 | Pfirsch ......................... | 257/333 |
| 6,252,288 B1 * | 6/2001 | Chang .......................... | 257/471 |
| 6,376,878 B1 * | 4/2002 | Kocon ......................... | 257/328 |
| 6,573,558 B2 | 6/2003 | Disney ......................... | 257/328 |

(Continued)

FOREIGN PATENT DOCUMENTS

| | | | | |
|---|---|---|---|---|
| WO | WO 00/68997 | 11/2000 | ............. | H01L 29/00 |
| WO | WO 02/067332 A2 | 9/2002 | ............. | H01L 29/78 |
| WO | WO 2005/078802 A2 | 8/2005 | ............. | H01L 29/06 |

OTHER PUBLICATIONS

Office Action from German Patent Application No. 102004046691.1-33, Aug. 17, 2005, pp. 1-5.

*Primary Examiner* — Meiya Li
(74) *Attorney, Agent, or Firm* — Murphy, Bilak & Homiller, PLLC

(57) ABSTRACT

A high-voltage-resistant semiconductor component (1) has vertically conductive semiconductor areas (17) and a trench structure (5). These vertically conductive semiconductor areas are formed from semiconductor body areas (10) of a first conductivity type and are surrounded by a trench structure (5) on the upper face (6) of the semiconductor component. For this purpose the trench structure has a base (7) and a wall area (8) and is filled with a material (9) with a relatively high dielectric constant ($\epsilon_r$). The base area (7) of the trench structure (5) is provided with a heavily doped semiconductor material (11) of the same conductivity type as the lightly doped semiconductor body areas (17), and/or having a metallically conductive material (12).

26 Claims, 7 Drawing Sheets

(56) References Cited

U.S. PATENT DOCUMENTS

| | | | |
|---|---|---|---|
| 6,608,350 B2 | 8/2003 | Kinzer et al. | 257/341 |
| 6,624,472 B2 | 9/2003 | Hurkx et al. | 257/339 |
| 6,677,641 B2 * | 1/2004 | Kocon | 257/329 |
| 6,781,194 B2 * | 8/2004 | Baliga | 257/327 |
| 6,800,897 B2 * | 10/2004 | Baliga | 257/328 |
| 2004/0135178 A1 * | 7/2004 | Onose et al. | 257/262 |
| 2004/0173813 A1 * | 9/2004 | Chang | 257/107 |
| 2005/0247966 A1 * | 11/2005 | Adkisson et al. | 257/301 |
| 2007/0052058 A1 | 3/2007 | Hirler et al. | |

* cited by examiner

HIGH-VOLTAGE-RESISTANT SEMICONDUCTOR COMPONENT HAVING VERTICALLY CONDUCTIVE SEMICONDUCTOR BODY AREAS AND A TRENCH STRUCTURE

CROSS-REFERENCE TO RELATED APPLICATIONS

This application claims priority from German Patent Application No. 10 2004 046 697.1, which was filed on Sep. 24, 2004, and is incorporated herein by reference in its entirety.

TECHNICAL FIELD

The invention relates to a high-voltage-resistant semiconductor component having vertically conductive semiconductor body areas and having a trench structure, and to a method for its production.

BACKGROUND

In the case of conventional vertical MOSFETs, the maximum donor concentration $[N_D]$ in an $n^-$-region and hence also the electrical conductivity of the $n^-$-region is governed by the required blocking capability, and vice versa. In the event of an avalanche breakdown, the approximately $1.5 \times 10^{12}$ cm$^{-2}$ donors are ionized, and find their opposite charge in the acceptor charge of the p-conductive region of the MOSFET structure. If the aim is to allow a higher donor concentration, then opposite charges for the donor atoms in the $n^-$-region must be found, for example in the same conductor plane. In the case of MOS field plate transistors with a trench structure, as are known from the document U.S. Pat. No. 6,573,558 B2, this is achieved by means of the charge carriers in the field plate. In the case of compensation components, such as "CoolMOS", which have $n^-$-regions and p-regions arranged alternatively in cells, this is achieved by means of acceptors in the p-regions as opposite charges.

In this context, the expression an $n^-$-region or $p^-$-region is understood as meaning an area of a semiconductor component which is lightly doped and has an impurity concentration $[N_D]$ or $[N_A]$ below $[N_D]$ or $[N_A] \leq 5 \times 10^{15}$ cm$^{-3}$, respectively where $[N_D]$ is the donor concentration and $[N_A]$ is the acceptor concentration. In compensation components and components according to the present invention, this area can also be extended up to $1 \times 10^{17}$ cm$^{-3}$. The expression an n-region or p-region means an area of a semiconductor component with medium doping and having an impurity concentration between $5 \times 10^{15}$ cm$^{-3} \leq [N_D]$ and $[N_A] \leq 1 \times 10^{18}$ cm$^{-3}$, respectively.

An $n^+$-region or $p^+$-region means an area of a semiconductor component which is heavily doped and has an impurity concentration above $1 \times 10^{18}$ cm$^{-3} \leq [N_D]$ and $[N_A]$, respectively.

If the aim is to improve the electrical conductivity of an $n^-$-region in the case of compensation components, such as "CoolMOS", further, then the compensation level must be set ever more accurately. This is now reaching the limits of technical feasibility. The MOS field plate transistors which are known from U.S. Pat. No. 6,573,558 B2 with a trench structure in contrast have the disadvantage that the entire reverse voltage is dropped at the drain-side end to the $n^-$-region, so that very thick isolation layers are required. A continuous load of 600 V would require $SiO_2$ with a thickness of about 4-6 µm, thus leading to a relatively large structure grid and to considerable technological problems.

Semiconductor devices with a trench structure are also known from the documents U.S. Pat. No. 4,893,160 and U.S. Pat. No. 5,282,018. In these trench structures, avalanche breakdowns in the lightly doped epitaxial area between a gate arrangement in the trench structure and a drain area with a heavily doped substrate are avoided by means of medium to heavily doped zones in the area of the trench bases. Further semiconductor devices with a trench structure are known from the document U.S. Pat. No. 6,608,350 B2. Known trench structures such as these can be used to produce a high-voltage transistor with a low forward resistance on an $n^+$-conductive semiconductor substrate with a lightly doped semiconductor body area on the $n^+$-conductive semiconductor substrate, by defusing compensation regions out of the trench structure into the lightly doped semiconductor body area. The trench can be filled with a dielectric or with a highly resistive material, as is also described in DE 19848828 C2.

The above forward resistance $R_{on} \cdot A$ and the breakdown voltage of a high-voltage-resistant semiconductor component for a power transistor are linked by the doping and length and the thickness of a drift path, that is to say of the lightly doped $n^-$-region which mainly provides the blocking voltage. High doping and a short drift path mean a low forward resistance, but also a low breakdown voltage. Conversely, light doping and a long drift path are required for a high breakdown voltage, which results in a high forward resistance $R_{on} \cdot A$.

The German Patent Application DE 10 2004 007 197.7 describes a semiconductor device in which significantly higher drift path doping is made possible by means of layers which are arranged parallel to the drift path and are composed of a material with a high dielectric constant, which is referred to in the following text as a high-k material (high dielectric constant material), thus resulting in a considerably lower forward resistance. With typical trench widths and widths of the $n^-$-region in the region of a few micrometers, forward resistance values $R_{on} \cdot A$ which are nowadays better than in the case of "CoolMOS" by a factor of at least 3 can be achieved for 600 V components. A transition from a material with a high dielectric constant to a material with a low dielectric constant such as silicon is located on the lower face of the high-k material layers. This is associated with a corresponding sudden change in the normal component of the electrical field strength E, because this field component is described by:

$$\epsilon_{hk} E_{hk} = \epsilon_{Si} E_{Si},$$

where $\epsilon_{hk}$ is the high dielectric constant of the trench material or of the high-k material, $E_{hk}$ is the field strength at the boundary surface in the material with the high dielectric constant, $\epsilon_{Si}$ is the dielectric constant of the silicon and $E_{Si}$ is the field strength in the adjacent silicon. Since the field strength $E_{hk}$ in the high-k region typically in its own right amounts to half the breakdown field strength of the semiconductor material, the field strength $E_{Si}$ in the semiconductor located underneath this also rises, with a relative dielectric constant of the high-k region of even only 50 to well above the breakdown field strength of the silicon as the semiconductor material, so that the desired blocking capability cannot be achieved in the proposed structures unless the region which is filled with a high-k material, or the filled trench, achieves the transition to the heavily doped $n^+$-region of the heavily doped substrate very precisely, which is technologically scarcely feasible, but has been found to be disadvantageous in the previous technology.

Another critical case of such high-voltage-resistant semiconductor component structures occurs when the high-k region extends too far into the heavily doped n⁺-semiconductor region of the substrate. This results in a field strength peak at the transition from the n⁻-doped drift path to the heavily doped region, and this likewise reduces the blocking capability. These high-voltage-resistant semiconductor components are therefore subject to the problem that the high-k region must end as precisely as possible at a heavily doped region of the semiconductor substrate, which, in technological terms, is an object which can be achieved only with difficulty, not least because the trench structures for the high-k regions are incorporated using technologies such as laser ablation or plasma etching, which are not suitable for the removal of material being stopped between lightly doped epitaxial layer areas and heavily doped substrate areas.

SUMMARY

One objective of the invention is to reduce as much as possible the field strength peaks at the trench base of a high-k region, which disadvantageously reduce the breakdown withstand voltage of power semiconductor components in the prior art, despite the trench structures being incorporated less accurately in a semiconductor epitaxial layer. At the same time, another object of the invention is to improve the breakdown withstand voltage for semiconductor components such as these.

This object is achieved by the independent claims. Advantageous developments of the invention are specified in the dependent claims.

The invention specifies a high-voltage-resistant semiconductor component having vertically conductive, lightly doped semiconductor body areas as drift path regions of a first conductivity type, and having a trench structure on its upper face. In this case, the trench structure at least partially surrounds the vertically conductive lightly doped semiconductor body areas, and has a base area and a wall area. The trench structure is filled with a material with a high relative dielectric constant, a so-called "high-k material", with the base area of the trench structure having a heavily doped semiconductor material of the same conductivity type as the lightly doped semiconductor body areas, and/or having a metallically conductive material.

This semiconductor component has the advantage that the heavily doped semiconductor material of the same conductivity type as the lightly doped semiconductor body areas and the metallically conductive material in the base area of the trench structure make it possible to reduce field strength peaks such as those which occur when the heavily doped n⁺-semiconductor region of the substrate is not reached, within a very short distance of a few nanometers in this n⁺-conductive base area or metallic base area. To do this, the introduction of the trench structures is interrupted even before the heavily doped substrate is reached, and the layer according to the invention is introduced in the base area of the trench structure.

These high-voltage-resistant semiconductor components furthermore have the advantage that the waste during manufacture is considerably reduced, not least because a wider tolerance band is now possible for the depth of the trench structure in the lightly doped epitaxial layer of the semiconductor structure. The range of depth scatter above a semiconductor wafer is also in consequence therefore no longer as critical as in the case of the semiconductor structures which are known from the Patent Application DE 10 2004 007 197.7.

In one preferred embodiment of the invention, the lightly doped semiconductor body areas are arranged in the form of plates alternately with corresponding trench structures in the form of plates on the upper face of the semiconductor component. In this case, the trench structures which are in the form of plates are formed from the high-k material. The width of the trench structures which are in the form of plates or the width of the lightly doped semiconductor body areas governs the blocking capability of the semiconductor components. If a critical width of the lightly doped semiconductor body areas which are in the form of plates is exceeded, then complete blocking of the n⁻-conductive drift zone is not ensured.

In a further embodiment of the invention, the lightly doped semiconductor body areas are arranged in the form of columns with a circular, square or other polygonal, preferably hexagonal, cross section on the upper face of the semiconductor component and are surrounded by the trench structure. In the case of an arrangement in the form of a column such as this with a surrounding trench structure, the trench structure is introduced by means of laser ablation or by means of plasma etching. Both methods can represent an anisotropic process or anisotropic etching, with the material removal rate or the etching rate in the direction of the depth of the trench structure being considerably greater than the removal rate from the side wall structures of the trenches.

The wall area of the trench structure in one further preferred embodiment of the invention has an isolation layer as a protective layer, with the isolation layer having an oxide or a nitride from the group of insulating materials such as $SiO_2$, $Si_3N_4$, $TiO_2$, $HfO_2$, $Ta_2O_5$, $Al_2O_3$ or AlN, or mixtures thereof. An insulating wall structure such as this can at the same time protect the walls during the filling of the trench structure, in particular during the introduction of heavily doped semiconductor material or metallically conductive material into the base area of the trench structure.

During the process of etching such conductive layers, which can be applied in the base of the trench, from the wall structure, the protective layers which have been mentioned above and are composed of oxides or nitrides can act as etching stop layers. On the other hand, it is also possible to provide the wall area of the trench structure with a wall layer composed of semiconductor material, of the opposite conductivity type to the first conductivity type of the lightly doped area. This creates a space charge zone, which improves the breakdown strength of the semiconductor device.

In a further preferred embodiment of the invention, the base area of the trench structure, as a heavily doped semiconductor material, has a material whose impurity concentration is $$N \geq \epsilon_r \epsilon_0 (E_{crit})^2 / E_g$$

where $\epsilon_r$ is the relative dielectric constant, $\epsilon_0$ is the absolute dielectric constant of a vacuum, $E_{crit}$ is the critical field strength and $E_g$ is the band gap of the semiconductor material. A heavily doped layer such as this in the base area of the trench reduces the field strength peak which occurs without such a layer when the trench is not sufficiently deep or when the trench is introduced too deeply. This improves the withstand voltage of the power transistor.

The base area of the trench structure preferably has a crystalline silicon, polysilicon or silicon carbide with an impurity concentration of $$1 \cdot 10^{18} \text{ cm}^{-3} \leq N_D \text{ or } N_A \leq 5 \cdot 10^{20}$$

as the heavily doped semiconductor material. This heavy doping makes it possible to reduce the voltage peaks which would otherwise occur in the base area and to improve the breakdown withstand voltage of the component in such a way that no avalanche affect can occur.

Silicides, preferably tungsten or cobalt silicide, have been proven as metallically conductive materials in the base area. Silicides such as these are not only metallically conductive but are also temperature-resistant, so that high power losses do not adversely affect the functionality of the metallically conductive materials arranged in the base area.

In a further preferred embodiment to the invention, metals including titanium, hafnium, tantalum or alloys thereof are used as the metallically conductive materials. These materials cannot, however, be subject to indefinitely high temperature loads. On the other hand, it is also possible to use nitrides of titanium, hafnium or zirconium as conductive layers in the base area of the trench structure, which are themselves electrically conductive and likewise have good temperature resistance.

A highly conductive or metallic contact can be arranged on the upper face of the filled trench structure, and is electrically connected to a source electrode of a high-voltage-resistant MOS power transistor or to an emitter diode of a high-voltage-resistant IGBT power transistor. An embodiment of the invention such as this has the advantage that the upper face of the trench structure, in particular of the high-k material, is at the same potential as the source electrode and the emitter electrode. The contact can alternatively also be connected to another fixed potential or to the gate electrode. It is possible for the lightly doped semiconductor body areas to have different gate structures on their upper faces. While a gate structure is arranged planar and flat on the semiconductor body area, a gate structure can also be buried vertically in the upper face of the lightly doped semiconductor body area, and leads to a vertical gate channel which requires less surface area than that which can be achieved by a planar or flat gate structure. The vertical gate can be arranged in the same trench as the high-k material.

A further aspect of the present invention relates to a semiconductor device having a semiconductor component based on the structure described above. In a first embodiment of the invention, this semiconductor device has a Schottky diode material. In this case, the trench structure which is filled with a high-k material surrounds semiconductor body areas of a lightly doped semiconductor body area of a first conductivity type, which has the Schottky diode structure on its upper face. A layer of heavily doped semiconductor material or a metal layer is arranged in the base area of the trench structure. The lightly doped semiconductor body area of the first conductivity type is arranged on a heavily doped substrate of the same conductivity type. The upper faces of the semiconductor body areas have a metal coating of a Schottky contact material, which forms an individual electrode of a Schottky diode. The individual electrodes of the plurality of semiconductor body areas are electrically connected in parallel to form an overall electrode, while the opposite electrode is formed by the heavily doped substrate of the same conductivity type as the lightly doped semiconductor body area. For this purpose, the heavily doped substrate has a metal coating, which forms the opposite electrode, on its rear face.

In a further preferred embodiment of the semiconductor device, this semiconductor device has a high-voltage-resistant PIN or NIP diode structure. This high-voltage-resistant diode structure has a trench structure which is filled with a high-k material and has a layer composed of heavily doped semiconductor material or a metal layer in the base area of the trench structure, in order to ensure the resistance to high voltage. The trench structure surrounds a lightly doped semiconductor body area of a first conductivity type. This semiconductor body area is arranged on a heavily doped substrate of the same conductivity type as the lightly doped semiconductor body area.

The filled trench structure surrounds a plurality of semiconductor body areas of the lightly doped semiconductor body area and the upper face areas of the semiconductor body areas have a medium to heavily doped diffusion zone of the opposite conductivity type, which is coated with an individual metal electrode. The plurality of individual metal electrodes in the semiconductor body areas are electrically connected in parallel to form an overall electrode, and are electrically connected to the filled trench structure on the upper face of the semiconductor body area. The opposite electrode of the high-voltage-resistant PIN or NIP diode is formed by a heavily doped substrate of the same conductivity type as the lightly doped semiconductor body area. For this purpose, the lower face of the semiconductor device has a metal layer which is conductively connected to the heavily doped substrate, and forms an opposite electrode for the upper face of the semiconductor device.

Provision is also made for the high-k material and the heavily doped base area of the trench structure or the metal layer in the base area of the trench structure to form a high-voltage-resistant MOS power transistor structure. In this MOS power transistor structure, the trench structure is composed of a high-k material, which surrounds a lightly doped semiconductor body area of a first conductivity type. This lightly doped semiconductor body area is arranged on a heavily doped semiconductor substrate, which is of the same conductivity type as the lightly doped epitaxial layer with the trench structure.

The upper face areas of the semiconductor body areas are equipped with an MOS structure with individual source electrodes and individual gate electrodes. For this purpose, a medium to heavily doped impurity zone of the opposite conductivity type is provided for the semiconductor body areas in the surface area, and forms a gate channel area towards the edge area of the semiconductor body area. The impurity zone has a source electrode, and the plurality of source electrodes in the semiconductor body areas are electrically connected in parallel to form a common source electrode, and are electrically connected to the trench structure. The gate channel area of the medium to heavily doped region in the edge area of the semiconductor body areas is covered by a gate oxide. A gate electrode is arranged on the gate oxide, with the plurality of individual gate electrodes in the semiconductor body areas being interconnected to form a common gate electrode above the upper face of the lightly doped semiconductor body area. The heavily doped substrate material, which is of the same conductivity type as the lightly doped semiconductor body area, has a metal coating on its lower face, and this is used as a large-area drain electrode.

An MOS power structure such as this has the advantage (when a metallically conductive or heavily doped material is arranged in the trench structure with the high-k material in the base area) that the field strength peaks in the lightly doped semiconductor body area, adjacent to the base area of the trench structure which is filled with the high-k material, are reduced, and the full breakdown withstand voltage can be achieved for devices such as these. A semiconductor device with a high-voltage-resistant IGBT (Insulated Gate Bipolar Transistor) is designed in a similar way to the MOS transistor, but the heavily doped substrate is of the opposite conductivity type to the lightly doped semiconductor body area.

This high-voltage-resistant IGBT is a bipolar transistor with an insulated gate connection. The structure of this power transistor differs from the structure of a high-voltage-resistant MOS power transistor only in that the trench structure is embedded with a conductive layer on the trench base in a lightly doped semiconductor body area of one conductivity type, which is arranged on a heavily doped substrate of the opposite conductivity type. This results in a bipolar transistor of the pnp type or of the npn type, depending on the conductivity type and the combination of the regions. The substrates of the components described above, such as the Schottky diode, the PIN diode, the MOSFET or the IGBT, can been made to be virtually indefinitely thin.

A method for production of a plurality of semiconductor chips from a semiconductor wafer which has semiconductor chip positions arranged in rows and columns is described by the following method steps. First of all, a lightly doped semiconductor wafer of a first conductivity type or an epitaxial layer which is lightly doped with the first conductivity type and is deposited on a semiconductor wafer which is heavily doped with the first conductivity type is produced. Trench structures with a base and a wall area are then introduced into the lightly doped surface area of the semiconductor chip positions on the semiconductor wafer. After this, heavy doping of the same conductivity type as the lightly doped areas can be introduced into the base area of the trench structure, or a metallically conductive coating is introduced in the base area of the trench structure. When introducing a layer into the base area, care should be taken to ensure that the walls of the trench structure do not themselves have any conductive coating. This can preferably be ensured by means of anisotropic deposition of the conductive layer in the trench structure with subsequent isotropic etching, with a metallic coating being removed from the wall area. The trench structure is then filled with a high-k material.

The advantage of this method is that the introduction of heavy doping or of a metallically conductive coating on the base of the trench structure decreases the field strength peaks which can occur either at the side or underneath the trench structure at the transition between the trench structure and a lightly doped semiconductor region, by means of the metallically conductive or heavily doped layer on the base of the trench, so that the full theoretically feasible breakdown voltage over the drift path then becomes possible.

The base area of the trench structure can be doped by means of a directed ion implantation technique. For this purpose, the upper face of the semiconductor component is protected by a photoresist layer except for the trench structure itself, and the ion beams do not pass through this photoresist layer. If the ion beams are aligned orthogonally with respect to the surface of the semiconductor wafer, it is possible to achieve very precise doping of the base area of the semiconductor wafer. In order to minimize the risk of doping of the side walls, they can be covered in advance with an oxide layer or nitride layer of silicon or aluminum. Tantalum oxides and hafnium oxides can also be used to protect the side walls against the ingress of the dopant. On the other hand, if the side walls have been loaded with dopant, the thin layer loaded with dopant can be removed by isotropic etching.

Physical methods such as sputtering, vapor-deposition or chemical methods such as chemical gas-phase deposition or electrolytic deposition are advantageously used for application of a metallically conductive layer in the area of the trench base, preferably composed of a silicide such as tungsten silicide and/or cobalt silicide. In this case as well, it is advantageous to protect the wall areas of the trench structure by means of an effective protective layer before the introduction of the metallic layers on the trench base. After the production of the filled trench structure, for which purpose the trench structure is filled with a material with a high relative dielectric constant, a so-called high-k material, manufacturing steps are carried out to produce functional semiconductor chips on the semiconductor wafer, and the semiconductor wafer is then cut up into individual semiconductor chips. Once the semiconductor chips have been manufactured, these chips are processed to form corresponding high-voltage-resistant semiconductor devices, based on the device variants described above.

In summary, it can be stated that a heavily doped or metallically conductive region in the base area of the trench structure makes it possible to reduce the high field strength peaks at the transition from the high-k material to a lightly doped semiconductor body area over a very short distance. For example, a field of $10^6$ V/cm in silicon with a doping of $10^{19}$ cm$^{-3}$ is dissipated over a distance of only 6 nm. In this case, a voltage of only just 0.3 V is dropped across this distance, so that the charge carriers cannot absorb sufficient energy in this case to generate new charge carriers by impact ionization. No avalanches are thus generated so that the breakdown voltage remains uninfluenced by the high field strength peak which occurs in this area. However, if the doping were to be only $10^{16}$ cm$^{-3}$, then the breakdown voltage would in contrast fall from 600 V to only 200 V, which is associated with a high field strength peak in the transition area, which could lead to an avalanche breakdown.

In addition to the heavy doping of the semiconductor material in the transition area, it is also possible to introduce a metallic layer composed of a silicide at the base of the trench underneath the high-k region. This layer acts as a lower electrode of the high-k region and prevents the strong electrical field from entering the lightly doped semiconductor material located underneath it. The invention thus advantageously means that the electrical field underneath the high-k regions is dissipated over short distances by heavily doped material or by metallic material. Furthermore, the invention advantageously means that the trench structure is self-adjusting, and a heavily doped coating or metallic coating can be introduced very easily in the depth of the high-k region in this case.

BRIEF DESCRIPTION OF THE DRAWINGS

The invention will now be explained in more detail with reference to the attached figures.

DETAILED DESCRIPTION

Figure 1:
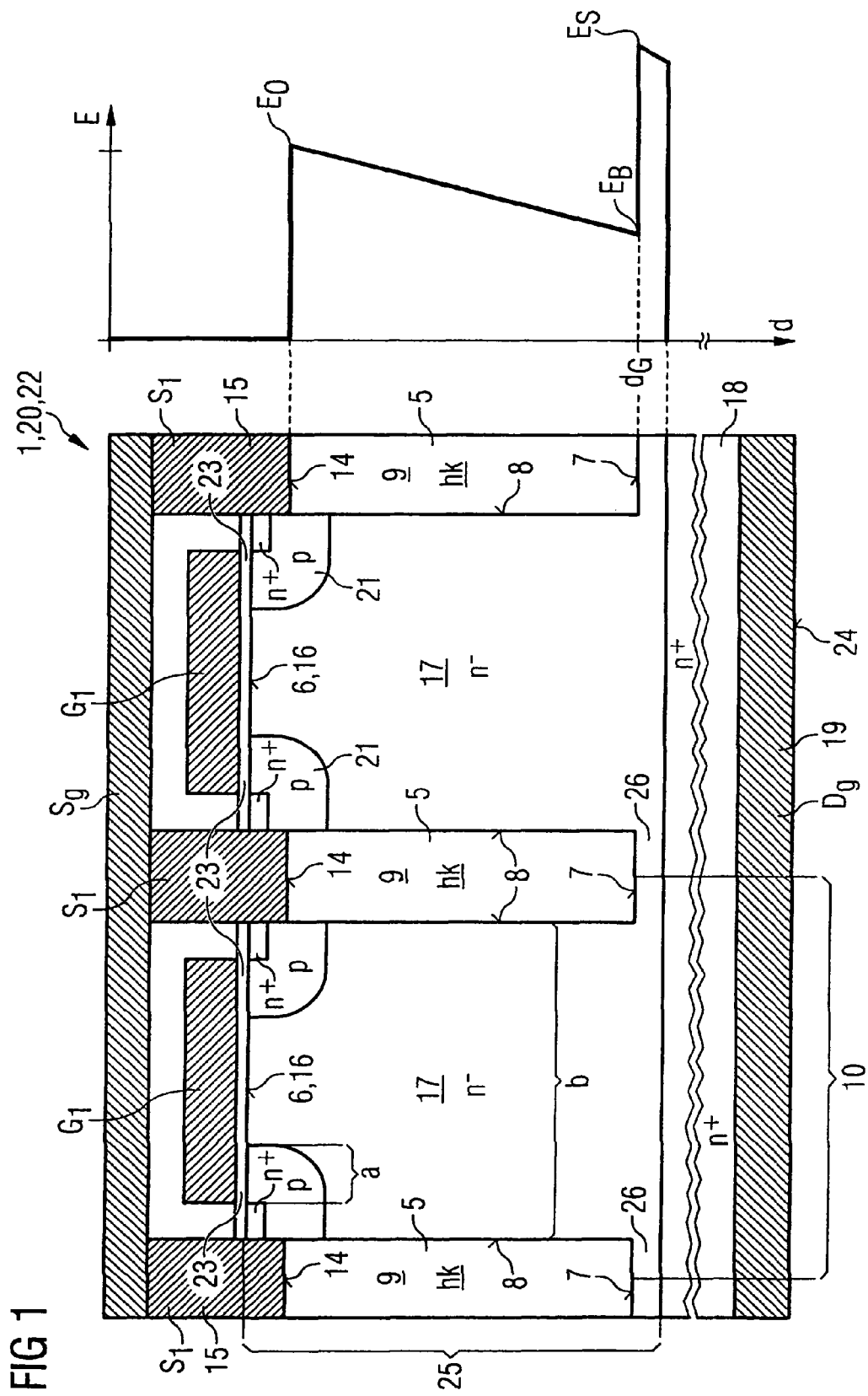
FIG. 1 shows the principle of the profile of the electrical field strength E in a high-voltage-resistant semiconductor component with a filled trench structure in a lightly doped semiconductor body area without any buried conductive layers according to the invention in the trench base area, as a function of the vertical position coordinate d.

FIG. 1 shows the principle of the profile of the electrical field strength E as a function of the vertical position coordinate d in a high-voltage-resistant semiconductor component 1 with a filled trench structure 5, whose trench base area 7 is arranged in a lightly doped semiconductor body area 17. The trench structure 5 is filled with a material 9 with a high relative dielectric constant Er This structure does not yet have the conductive buried layer according to the invention in the trench base area 7. The field strength E is initially at its highest on the upper face 14 of the trench structure 5, with $E_o$, and decreases to $E_s$ towards the base area 7 of the trench structure 5. However, a field strength peak $E_s$ is formed within the buffer layer 26 at the transition from the base area 7 to the lightly doped semiconductor body area 17, before then being completely dissipated in the heavily doped substrate area 18.

This field strength peak $E_s$ in the buffer layer 26 can lead to avalanche effects, thus reducing the breakdown voltage of the semiconductor component 1, and hence the breakdown withstand voltage of the semiconductor chip, and hence also of the power unit. This field strength peak $E_s$ is suppressed only if the trench structure extends with its base area 7 to the area of the heavily doped substrate 18. However, if the trench structure is continued deeper than to the heavily doped substrate area 18, then field strength peaks which reduce the breakdown voltage are also formed there. This is illustrated in the next figure, FIG. 2.

Figure 2:
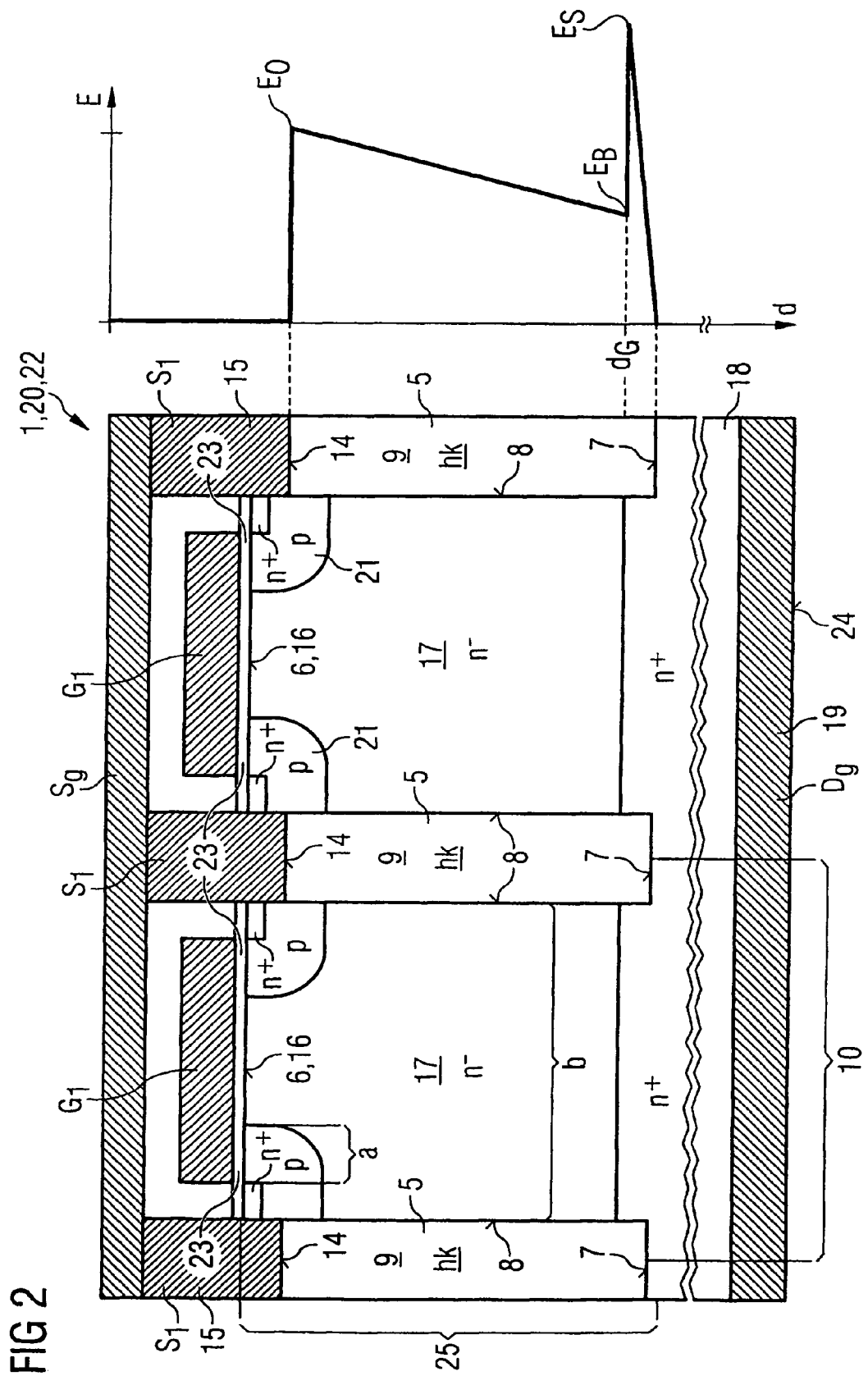
FIG. 2 shows the principle of the profile of the electrical field strength E in a high-voltage-resistant semiconductor component with a filled trench structure with a trench base area which is arranged within a heavily doped semiconductor substrate area (without the conductive layer according to the invention in the trench base area), as a function of the vertical position coordinate d.

FIG. 2 shows the principle of the profile of the electrical field strength E as a function of the vertical position coordinate d in a high-voltage-resistant semiconductor component 1 with a filled trench structure 5, whose trench base area 7 is arranged within a heavily doped substrate area 18 (without the conductive buried layer according to the invention in the trench area). The high field strength $E_o$ on the upper face 14 of the trench structure 5 initially decreases as the depth d of the trench structure increases, but now forms a field strength peak $E_s$ around the trench structure to the adjacent lightly doped semiconductor body area 17 at the transition to the substrate doping. This therefore results in the requirement that the introduction of the trench structure is extremely critical with respect to the trench depth $d_G$ both in the situation in FIG. 1 in which the trench structure is not introduced sufficiently deeply, so that it does not reach the heavily doped substrate area 18, and in the situation shown in FIG. 2, in which the trench depth $d_G$ is too deep, and the trench which is filled with a material having a high relative dielectric constant $\epsilon_r$ projects too far into the heavily doped substrate area 18, so that field strength peaks occur in the transition area, and disadvantageously affect the breakdown voltage of the semiconductor component 1.

Figure 3:
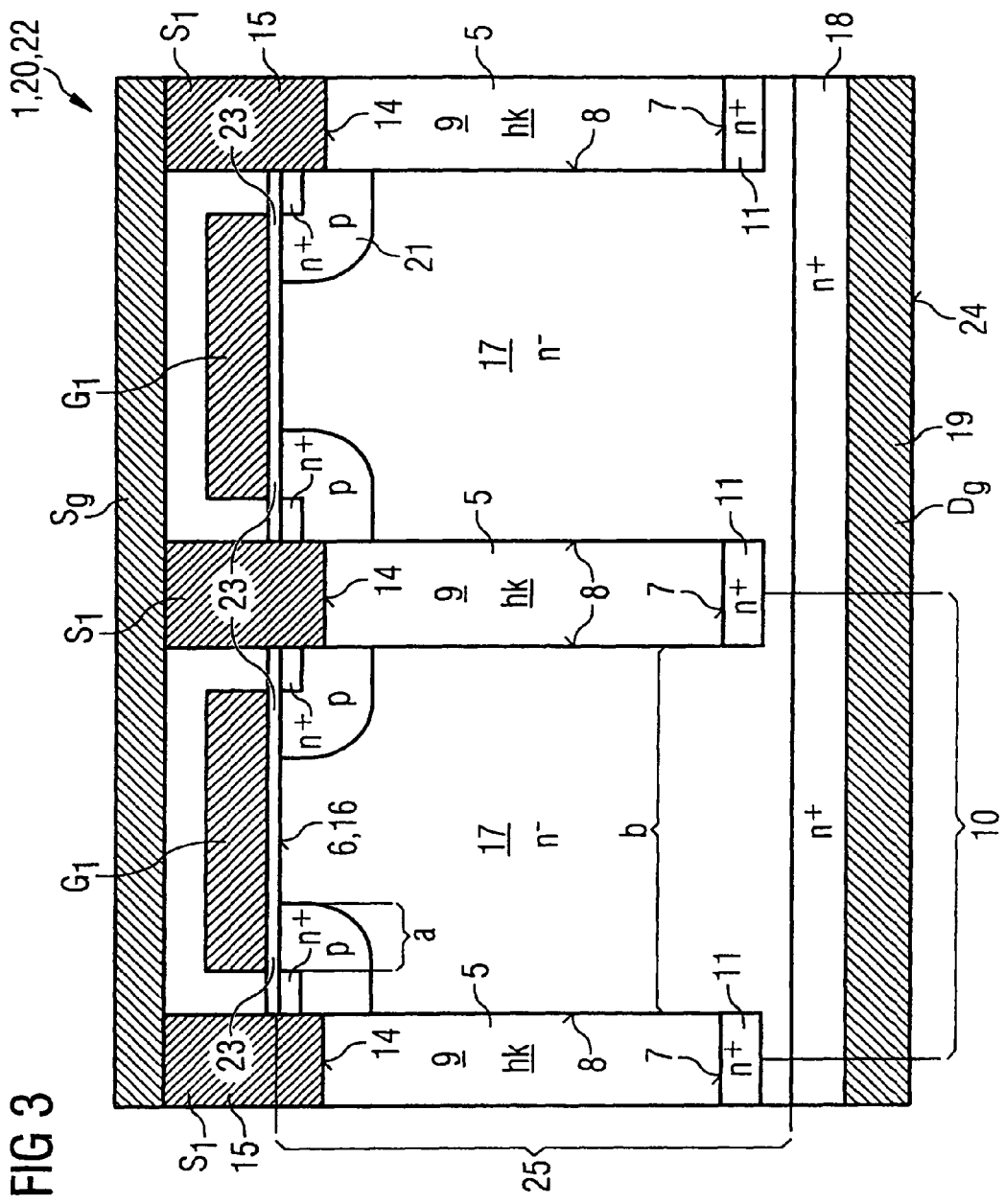
FIG. 3 shows a schematic cross section through a high-voltage-resistant semiconductor component with a filled trench structure according to a first embodiment of the invention.

FIG. 3 shows a schematic cross section through a semiconductor component 1 of a high-voltage-resistant semiconductor device 20 with a filled trench structure 5 according to a first embodiment of the invention. The trench structure 5 still ends before the heavily doped substrate area 18, and has a heavily doped semiconductor material layer 11 in its base area 7. This heavily doped semiconductor material layer 11 dissipates the field strength peak, which is still present in FIG. 1, within the heavily doped layer area 11, thus preventing any avalanche breakdown.

It is thus possible to use this semiconductor component to provide a high-voltage-resistant MOS power transistor with a planar gate arrangement without the trench structure having to reach the heavily doped substrate area 18. This considerably widens the previously narrow manufacturing tolerances relating to the trench depth.

This high-voltage-resistant semiconductor component 1, of which only two MOS semiconductor body areas 10 are shown, has a high-k material as the filling in the trench structure. This high-k material bounds individual MOS semiconductor body areas 10 of width b of a lightly doped semiconductor body area 17.

In this embodiment of the invention, the lightly doped semiconductor body area 17 is formed by an $n^-$-region. An MOS structure which in this embodiment forms two channel areas 21 is arranged on the upper face 6 of the semiconductor component, and thus on the upper face 16 of the semiconductor body area 10, with a gate oxide 23 being arranged between the gate electrode $G_1$ and the upper face 16 of the semiconductor body area. The channel area, with its channel length a, is formed by a medium-doped p-region 21, which has been diffused from the upper face 16 of the semiconductor body area 10 and is bounded on one side by a heavily doped $n^+$-region. The other boundary of the channel length a is formed by the lightly doped semiconductor body area 17.

The individual source electrodes $S_1$ make contact with the trench structure at the same time via a metallic contact 15 and are connected to one another via a common source electrode $S_G$. The individual gate electrodes $G_1$ are also connected in parallel by a common gate electrode, which is not shown in this illustration. While the channel region 21 is produced by diffusion of impurities into the lightly doped semiconductor body area 17 from the upper face 16 of the semiconductor body area 10, the source region is produced by $n^+$-doping by ion implantation and subsequent recrystallization, with the polysilicon gate electrode $G_1$ forming the masking. The channel length a is in this case achieved by means of a planar technology and thus cannot be indefinitely reduced in size.

The entire structure comprising the buried layers and the lightly doped semiconductor body area 17 is introduced into a lightly doped epitaxial layer 25. Widely differing techniques such as laser ablation and/or plasma etching can be used to produce the trench structure. In this case, photoresist techniques and diffusion methods as well as implantation methods are used for the structuring of the surface of each semiconductor body area 10. The filling of the trenches with a high-k material can also be modified by introducing a film capacitor into the trenches, instead of a homogeneous high-k material.

However, one critical factor for the present invention is that a heavily doped semiconductor area 11 is in this embodiment incorporated in the base area 7 of the trench structure 5 in order to reduce field strength peaks. The introduction of this heavily doped base area into the trench structure can likewise be carried out by ion implantation, to be precise at the same time as the doping of the $n^+$-source regions, provided that the trench structure has been incorporated in advance. In order to protect the wall areas 8 against the ingress of impurities and against contact with the high-k material, the wall faces 8 can be covered by a protective layer before the heavy doping is introduced into the trench base area 7. On the other hand, it is also possible to use an isotropic etching process to etch any heavy doping away from the trench walls 8 again after anisotropic introduction of the heavily doped layer 11 into the base area 7 and into the n$^+$-source areas. The heavily doped n$^+$-substrate is covered on the lower face 24 by a metal coating 19, which forms the drain electrode of the MOS power transistor structure 22.

Figure 4:
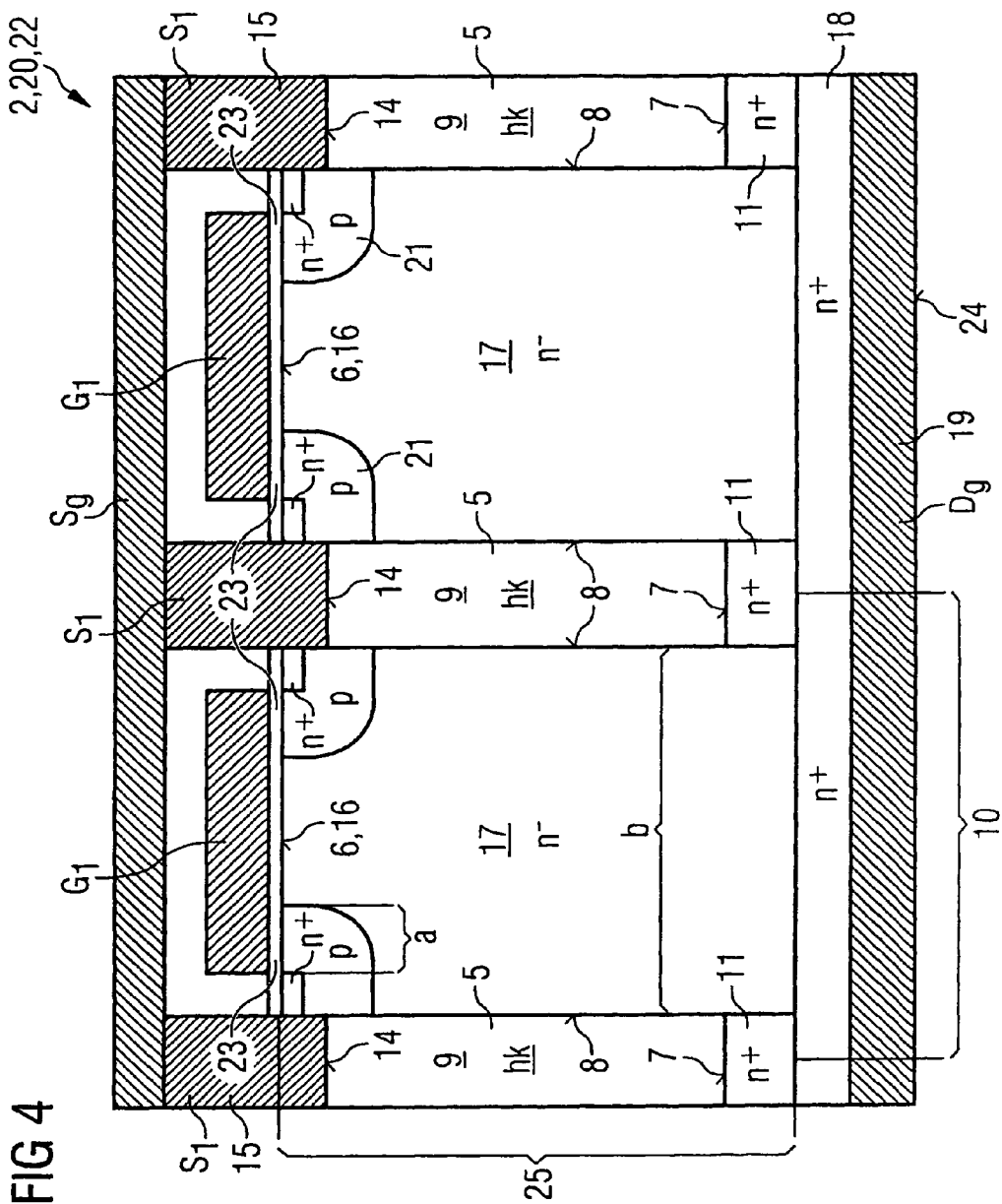
FIG. 4 shows a schematic cross section through a high-voltage-resistant semiconductor component with a filled trench structure according to a second embodiment of the invention.

FIG. 4 shows a schematic cross section through a high-voltage-resistant semiconductor component 2 based on a second embodiment of the invention, with a filled trench structure 5, whose trench base 7 is arranged in a lightly doped semiconductor area 17, and is provided with a buried layer 11 according to the invention, in the trench base area 7. Components with the same functions as those in FIG. 3 are identified by the same reference symbols, and will not be explained again.

The difference from the embodiment shown in FIG. 3 is that the heavily doped layer 11 has been incorporated deep in the trench base area 7 in such a way that it extends as far as the heavily doped substrate area 18. Once again, this embodiment of the invention reduces or avoids any field strength peaks in the transitional area from the base area 7 to the heavily doped substrate area 18. The level of the n$^+$-doping under the high-k region of the trench structure 5 should be at least $10^{18}$ cm$^{-3}$, preferably at least $10^{19}$ cm$^{-3}$, for silicon. In general, the minimum n$^+$-doping level is governed by the semiconductor characteristics, on the basis of the quotient:

$$\epsilon_R \times \epsilon_0 (E_{crit})^2 / E_g$$

In this case, $E_g$ is the band gap of the semiconductor material, $E_{crit}$ is the breakdown field strength for a doping level of $10^{16}$ cm$^{-3}$, $\epsilon_R$ is the relative dielectric constant of the semiconductor, and $\epsilon_0$ is the absolute dielectric constant of a vacuum. $E_{crit}$ for silicon is about $4 \cdot 10^5$ V/cm, $E_g$ is 1.1 eV and $\epsilon_r$ is 11.7. This results in the value of at least $10^{18}$ cm$^{-3}$, as already required above, for the concentration of impurities in the heavily doped n$^+$-region in the base area 7 of the trench structure 5.

Suitable semiconductor materials for such components include not only silicon but also silicon carbide and other, preferably III-V, semiconductor materials. As shown in FIG. 4 here, it is normally possible for these heavily doped areas of the trench base 7 to extend as far as the heavily doped substrate material 18. On the other hand, the field strength peaks are likewise decreased when the heavily doped material in the trench base area 7 does not extend as far as the heavily doped substrate 18. High-voltage-resistant semiconductor devices such as these can thus be produced more easily and more reliably than by using conventional technology, in which the trench structures must exactly reach the boundary area to the heavily doped substrate 18.

Figure 5:
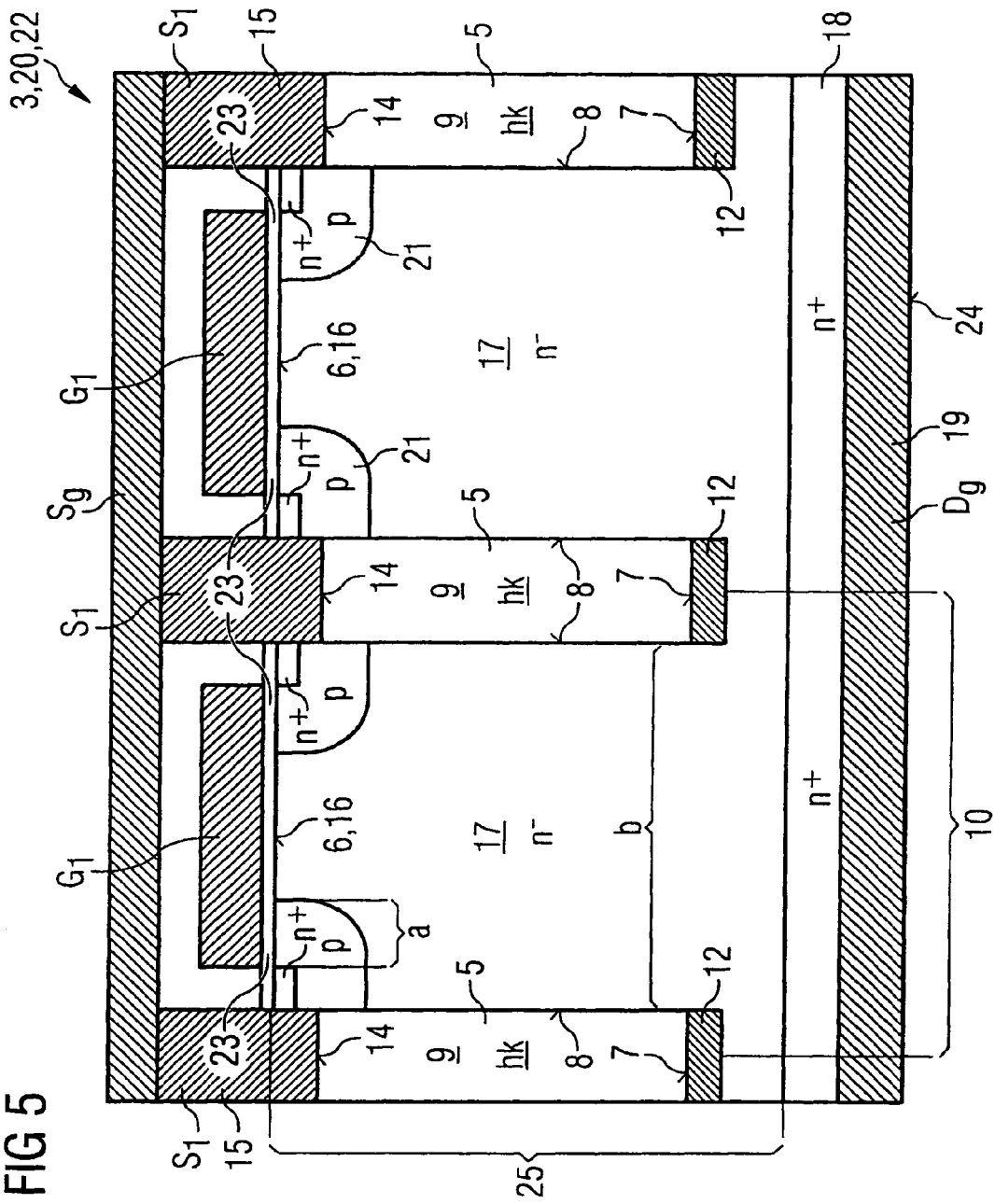
FIG. 5 shows a schematic cross section through a high-voltage-resistant semiconductor component with a filled trench structure according to a third embodiment of the invention.

Instead of the heavily doped n$^+$-regions in the trench base area 7, it is also possible to use a metallic layer, as is shown in a third embodiment of the invention in FIG. 5.

FIG. 5 shows a schematic cross section through a high-voltage-resistant semiconductor component 3 with a filled trench structure 5 based on a third embodiment of the invention. The trench base 7 is arranged in a lightly doped semiconductor body area 17, with the trench base 7 having a metallic coating 12. This metallic coating 12 in this embodiment of the invention is a silicide such as a tungsten silicide or cobalt silicide, which is introduced under the high-k region, with this layer 12 being used as the lower electrode of the high-k region and preventing the electrical field from entering the lightly doped semiconductor body area 17 located underneath it. The layer 12 can also make direct contact with the heavily doped substrate material 18.

Figure 6:
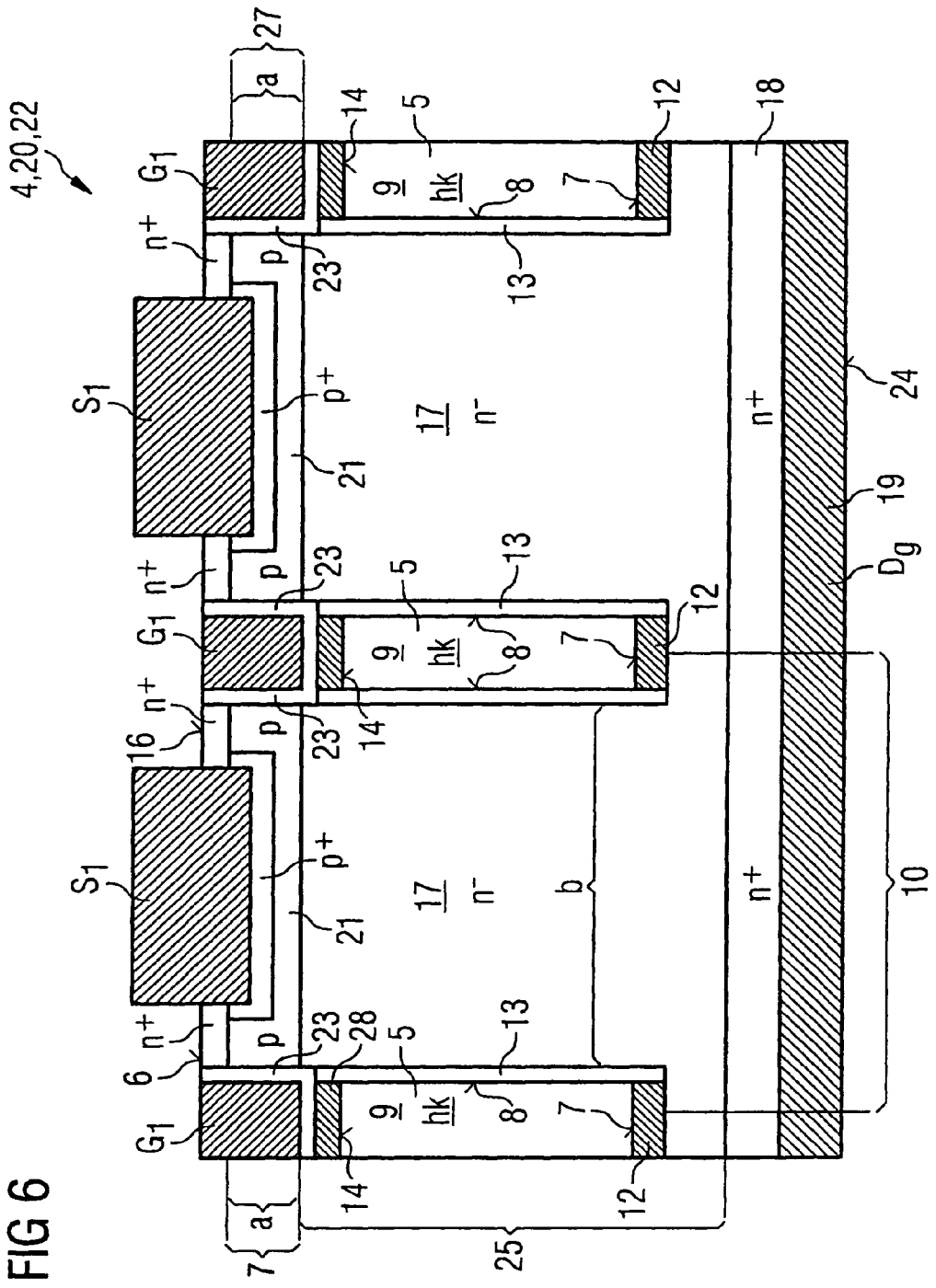
FIG. 6 shows a schematic cross section through a high-voltage-resistant semiconductor component with a vertical MOS channel area and a filled trench structure according to a fourth embodiment of the invention.

FIG. 6 shows a schematic cross section through a high-voltage-resistant semiconductor component 4 based on a fourth embodiment of the invention with a vertical MOS channel area 27 and a trench structure 5 based on a fourth embodiment of the invention. The trench structure surrounds a lightly doped semiconductor body area 17 with the trench base area 7 having a metallic layer 12. The MOS structure on the upper face 6 of the semiconductor component and on the upper face 16 differs considerably from the MOS structure as is known from the previous embodiments. Where components of the semiconductor component 4 have the same function as in the previous figures, they are identified by the same reference symbols, and will not be explained again.

Gate electrodes $G_1$ and individual source electrodes $S_1$ are arranged alternately alongside one another on the upper face 6 of the semiconductor component 4, with the source electrodes $S_1$ making contact with a source region with n$^+$-doping. This is then followed, staggered in the depth direction, by a heavily doped p$^+$-zone, which surrounds the source electrode $S_1$. This p$^+$-region is followed by a medium-doped channel zone 21 of the conductivity type p, which is controlled by a vertically arranged gate G1. The channel length a in this embodiment of the invention is arranged vertically and thus has a very small size, which makes the switching speed of the devices higher than that of the planar-arranged gate structures. This is because the channel length a corresponds to the diffusion depth of the p-regions.

The gate function is provided with the aid of gate electrodes $G_1$ and a gate oxide 23 in the vertical direction, together with the trench structure 5 for a material with a high relative dielectric constant $\epsilon_r$, by first of all producing the trench structure and by then applying the gate oxide 23 to the walls 8 of the trench structure as an isolation layer 13 at this time. Once the trench structure has been protected by a gate oxide in this way, the metallic layer 12 composed of suicides can be incorporated in the base area 7 in order to reduce field strength peaks. The high-k material is then incorporated above this metallic layer 12 in the trench base area 7, and is likewise sealed by an upper electrode 28 on the upper face 14 of the high-k material.

The side boundary formed by the gate oxide at the same time provides protection against metallic short circuits in the wall area 8. This upper electrode 28 is covered by an oxide, and the remainder is filled with a gate electrode $G_1$, up to the upper face 6 of the semiconductor component 4. Instead of introducing the gate oxide 23 in the vertical direction on the trench walls 8, this gate oxide 23 can also be introduced into the upper area of the trench structure 5 shortly before the introduction of the gate electrode metal.

The advantage of this semiconductor device is not just that the field strength peaks are decreased by the metallic layer 12, but also that the trench structure 5 is at the same time used to represent a vertical channel region. This has considerable manufacturing advantages, and short channel lengths a can also be achieved as a result of the shallow diffusion depth of the channel region p.

The overlap between the n$^+$-source region and the metallic gate electrode $G_1$ is small and is restricted just to the depth of the n$^+$-source regions, which has a thickness of only a few tens of nanometers, which cannot be achieved with planar structuring of channel lengths, despite ion implantation and self-masking, by the conductive gate material, as disclosed in the other embodiments. In particular, the gate structure requires only a very small surface area.

The heavily doped p⁺-region which surrounds the source metal of the source electrode $S_1$ is introduced in order to avoid a Schottky effect at the metal transition between the source electrode $S_1$ and the channel area 21, and thus to ensure a low contact resistance as well as high hole conductivity. The drain electrode of this MOS power transistor is provided by metallization on the lower face of the semiconductor component, so that the n⁺-substrate 18 forms a drain electrode $D_g$, which is shared by all the MOS body areas 10.

Figure 7B:
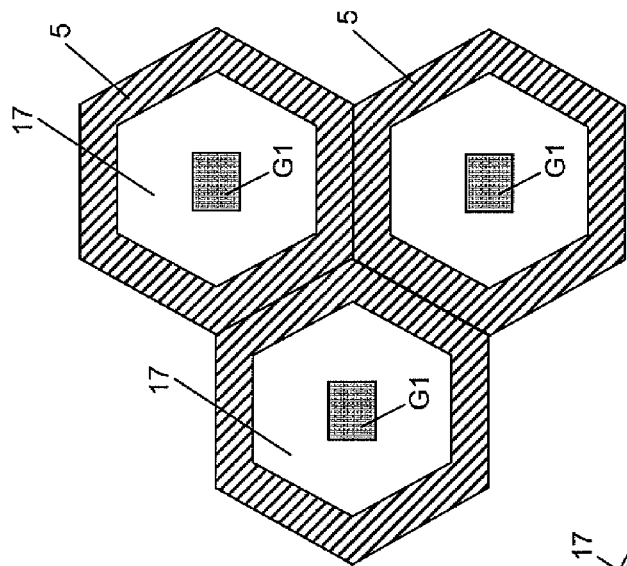
FIG. 7 illustrates a top view of a high-voltage-resistant semiconductor component having differently shaped cross sections on the upper face of the semiconductor component according to an embodiment of the invention.
Figure 7C:
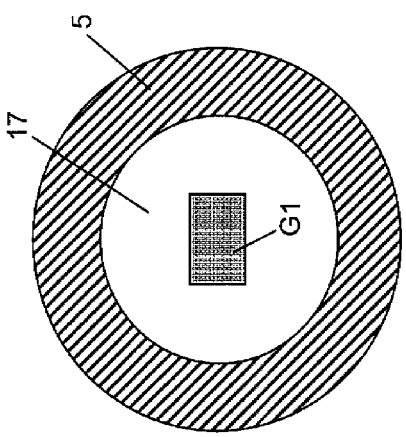
Figure 7A:
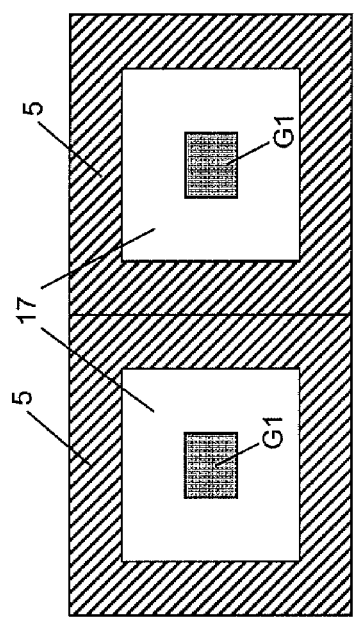

As referenced previously in the specification, a further embodiment of the invention is shown in FIGS. 7A-7C. FIGS. 7A-7C illustrate that the lightly doped semiconductor body areas 17 can be arranged in the form of columns with a circular, square or other polygonal preferably hexagonal, cross section on the upper face of the semiconductor component 6 and are surrounded by the trench structure 5.

LIST OF REFERENCE SYMBOLS

1 Semiconductor component (first embodiment)
2 Semiconductor component (second embodiment)
3 Semiconductor component (third embodiment)
4 Semiconductor component (fourth embodiment)
5 Trench structure
6 Upper face of the semiconductor chip
7 Base area
8 Wall area
9 Material with a high relative dielectric constant $\epsilon_r$
10 Semiconductor body area
11 Heavily doped semiconductor material or coating
12 Metallically conductive material
13 Isolation layer
14 Upper face of the trench structure
15 Metallic contact on the trench structure (on the upper face)
16 Upper face of the semiconductor cell with a lightly doped area
17 Lightly doped semiconductor body area
18 Heavily doped substrate
19 Metal coating
20 Semiconductor device
21 Diffusion zone or impurity zone
22 MOS power transistor structure
23 Gate oxide
24 Lower face of the semiconductor chip
25 Epitaxial layer
26 Buffer layer
27 Vertical MOS channel area
28 Upper electrode of the trench structure
$\epsilon_r$ Relative dielectric constant
$\epsilon_o$ Absolute dielectric constant of a vacuum
$S_1$ Source electrode
$S_g$ Common source electrode
$G_1$ Gate electrode for one cell
$D_g$ Common drain electrode
d Vertical position coordinate
$d_G$ Trench depth
b Width of the lightly doped semiconductor cell
a Channel length
E Electrical field strength
$E_0$ Electrical field strength on the upper face
$E_B$ Electrical field strength in the base area
$E_S$ Field strength peak

What is claimed is:

1. A high-voltage-resistant semiconductor component comprising:
an epitaxial layer of a first conductivity type arranged on a substrate of the first conductivity type;
a body region of the first conductivity type arranged in the epitaxial layer;
a channel region of a second conductivity type arranged in an upper part of the body region;
a source region of the first conductivity type arranged adjacent the channel region;
an insulator layer arranged between the channel region and a gate electrode;
at least one trench with sidewalls and a bottom, a lower electrode extending between the sidewalls at the bottom of the trench and having a lower side in contact with the epitaxial layer under the trench, an insulating material disposed on the lower electrode, the insulating material extending from an upper side of the lower electrode to below an upper side of the epitaxial layer so that the insulating material is recessed in the trench, and an upper electrode formed on the insulating material; and
a source electrode at least partially disposed in the trench above the insulating material and coupled to the source region, wherein the source electrode is integrated with the upper electrode.

2. The semiconductor component of claim 1, wherein the upper electrode and the lower electrode are arranged in the at least one trench structure.

3. The semiconductor component of claim 1, wherein the lower electrode of the at least one trench structure extends to the substrate.

4. The semiconductor component of claim 1, wherein the lower electrode of the at least one trench structure comprises a heavily doped semiconductor material layer of the first conductivity type.

5. The semiconductor component of claim 4, wherein the heavily doped semiconductor material layer has an impurity concentration of approximately $N \geq \epsilon_r \epsilon_o (E_{crit})^2 / E_g$, where $\epsilon_r$ is the relative dielectric constant, $\epsilon_o$ is the absolute dielectric constant of a vacuum, $E_{crit}$ is the critical field strength and $E_g$ is the band gap.

6. The semiconductor component of claim 4, wherein the heavily doped semiconductor material layer comprises crystalline silicon, polysilicon or silicon carbide.

7. The semiconductor component of claim 6, wherein the heavily doped semiconductor material layer has an impurity concentration of $1 \cdot 10^{18}$ cm⁻³ $\leq N_D$ or $N_A \leq$.

8. The semiconductor component of claim 1, wherein the lower electrode of the at least one trench structure comprises a metallic coating.

9. The semiconductor component of claim 8, wherein the metallic coating comprises a silicide.

10. The semiconductor component of claim 8, wherein the metallic coating comprises titanium, hafnium, tantalum or alloys thereof.

11. The semiconductor component of claim 1, wherein the channel region extends generally laterally along the gate electrode.

12. The semiconductor component of claim 11, wherein the trench structure is arranged directly below the source electrode.

13. The semiconductor component of claim 12, wherein the upper electrode of the trench structure comprises part of the source electrode.

14. The semiconductor component of claim 1, wherein the body region is arranged as a column in the epitaxial layer surrounded by the at least one trench structure.

15. The semiconductor component of claim 14, wherein the columnar body region has a polygonal cross section.

16. The semiconductor component of claim 15, wherein the polygonal cross section is circular, square, or hexagonal.

17. The semiconductor component of claim 1, wherein the body region and the at least one trench structure are arranged as adjacent plates in the epitaxial layer.

18. The semiconductor component of claim 1, wherein the insulating material of the at least one trench structure comprises a material having a relatively high dielectric constant.

19. The semiconductor component of claim 1, wherein the insulating material is spaced apart from the epitaxial layer under the trench by the lower electrode.

20. A semiconductor device comprising a semiconductor component, the semiconductor component comprising:
   an epitaxial layer of a first conductivity type arranged on a substrate of the first conductivity type;
   a body region of the first conductivity type arranged in the epitaxial layer;
   a channel region of a second conductivity type arranged in an upper part of the body region;
   a source region of the first conductivity type arranged adjacent the channel region;
   an insulator layer arranged between the channel region and a gate electrode;
   at least one trench structure arranged in the epitaxial layer and comprising a trench with sidewalls and a bottom, a lower electrode extending between the sidewalls at the bottom of the trench and having a lower side in contact with the epitaxial layer under the trench, an insulating material disposed on the lower electrode, the insulating material extending from an upper side of the lower electrode to below an upper side of the epitaxial layer so that the insulating material is recessed in the trench, and an upper electrode formed on the insulating material; and
   a source electrode at least partially disposed in the trench above the insulating material and coupled to the source region, wherein the source electrode is integrated with the upper electrode.

21. The semiconductor device according to claim 20, wherein the upper electrode and the lower electrode are arranged in the trench structure.

22. The semiconductor device according to claim 20, wherein the semiconductor device is a Schottky diode.

23. The semiconductor device according to claim 20, wherein the semiconductor device is a PIN or NIP diode structure.

24. The semiconductor device according to claim 20, wherein the semiconductor device is a MOS power transistor structure.

25. The semiconductor device according to claim 20, wherein the semiconductor device is an IGBT structure.

26. The semiconductor device according to claim 20, wherein the insulating material is spaced apart from the epitaxial layer under the trench by the lower electrode.

* * * * *